United States Patent
Dede et al.

(10) Patent No.: US 10,028,413 B2
(45) Date of Patent: Jul. 17, 2018

(54) HEAT TRANSFER MANAGEMENT APPARATUSES HAVING A COMPOSITE LAMINA

(71) Applicant: Toyota Motor Engineering & Manufacturing North America, Inc., Erlanger, KY (US)

(72) Inventors: Ercan Mehmet Dede, Ann Arbor, MI (US); Tsuyoshi Nomura, Nagoya (JP); Kenan Wang, Ann Arbor, MI (US); Paul Donald Schmalenberg, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 884 days.

(21) Appl. No.: 14/340,610

(22) Filed: Jul. 25, 2014

(65) Prior Publication Data

US 2016/0029518 A1    Jan. 28, 2016

(51) Int. Cl.
*H05K 7/20* (2006.01)
*F28F 13/14* (2006.01)
(Continued)

(52) U.S. Cl.
CPC ............ *H05K 7/205* (2013.01); *F28F 13/14* (2013.01); *H01L 23/373* (2013.01); *H01L 23/3735* (2013.01); *H05K 1/0212* (2013.01)

(58) Field of Classification Search
CPC .... F28F 13/14; H01L 23/373; H01L 23/3735; H05K 1/203; H05K 1/0212; H05K 7/205
(Continued)

(56) References Cited

U.S. PATENT DOCUMENTS

| 4,853,828 A | 8/1989 | Penn |
| 5,074,037 A | 12/1991 | Sutcliffe et al. |

(Continued)

FOREIGN PATENT DOCUMENTS

| JP | 2001221486 A | 8/2001 |
| JP | 2005223078 A | 8/2005 |
| JP | 3995382 B2 | 10/2007 |

OTHER PUBLICATIONS

Dede, "Simulation and Optimization of Heat Flow Via Anisotropic Material Thermal Conductivity," Computational Materials Science, 50 (2010) pp. 510-515.
(Continued)

*Primary Examiner* — Jianying Atkisson
*Assistant Examiner* — Joel Attey
(74) *Attorney, Agent, or Firm* — Dinsmore & Shohl, LLP

(57) ABSTRACT

Heat transfer management apparatuses are disclosed. In one embodiment, a heat transfer management apparatus includes a composite lamina having an insulator substrate and a plurality of thermal conductor traces coupled to the insulator substrate. The plurality of thermal conductor traces are arranged into a first enhanced thermal conduction region and a second enhanced thermal conduction region. The heat transfer management apparatus also includes a heat generating component mount and a temperature sensitive component mount in electrical continuity with the heat generating component mount, where a shielding path projection extends from the heat generating component mount towards the temperature sensitive component mount, and at least one of the thermal conductor traces is transverse to the shielding path projection between the heat generating component mount and the temperature sensitive component mount to steer heat flux away from the temperature sensitive component mount.

20 Claims, 9 Drawing Sheets

(51) Int. Cl.
*H01L 23/373* (2006.01)
*H05K 1/02* (2006.01)

(58) Field of Classification Search
USPC .......................................................... 165/185
See application file for complete search history.

(56) References Cited

U.S. PATENT DOCUMENTS

| | | | |
|---|---|---|---|
| 5,123,074 | A | 6/1992 | Yokota et al. |
| 5,268,812 | A | 12/1993 | Conte |
| 5,550,750 | A | 8/1996 | Wolff |
| 5,644,687 | A | 7/1997 | Agonafer et al. |
| 5,937,936 | A | 8/1999 | Furukawa et al. |
| 6,225,571 | B1 | 5/2001 | Bream et al. |
| 6,380,633 | B1 | 4/2002 | Tsai |
| 6,901,994 | B1 | 6/2005 | Jin-Chemg et al. |
| 6,957,692 | B1 | 10/2005 | Win-Haw et al. |
| 7,308,008 | B2 | 12/2007 | Freeman et al. |
| 7,490,309 | B1 | 2/2009 | Kukal et al. |
| 7,823,102 | B2 | 10/2010 | Chandra et al. |
| 8,601,428 | B2 | 12/2013 | Burrell et al. |
| 9,125,299 | B2 | 9/2015 | Wittenberg et al. |
| 2003/0174469 | A1 | 9/2003 | Morelock |
| 2004/0071035 | A1 | 4/2004 | Poechmueller |
| 2006/0144565 | A1 | 7/2006 | Tsai et al. |
| 2007/0045804 | A1 | 3/2007 | Lin et al. |
| 2007/0108595 | A1 | 5/2007 | Refai-Ahmed |
| 2008/0137308 | A1* | 6/2008 | MacDonald ............. F21K 9/00 361/720 |
| 2008/0288908 | A1 | 11/2008 | Hart et al. |
| 2009/0159905 | A1 | 6/2009 | Chen |
| 2009/0166003 | A1 | 7/2009 | Lai et al. |
| 2009/0180254 | A1 | 7/2009 | McGough |
| 2009/0302445 | A1 | 12/2009 | Pagila |
| 2010/0055812 | A1 | 3/2010 | Lin et al. |
| 2010/0072505 | A1 | 3/2010 | Gingrich, III |
| 2010/0147565 | A1 | 6/2010 | Fan et al. |
| 2010/0188848 | A1 | 7/2010 | Liaw |
| 2011/0222246 | A1 | 9/2011 | Hsieh et al. |
| 2011/0272179 | A1 | 11/2011 | Vasoya |
| 2011/0310559 | A1 | 12/2011 | Horng et al. |
| 2012/0147565 | A1 | 6/2012 | I et al. |
| 2012/0201008 | A1 | 8/2012 | Hershberger et al. |
| 2012/0294042 | A1 | 11/2012 | Sung et al. |
| 2012/0329183 | A1 | 12/2012 | Wang |
| 2014/0092560 | A1 | 4/2014 | Gibbs et al. |
| 2014/0160684 | A1* | 6/2014 | Wittenberg .......... H05K 1/0203 361/719 |
| 2014/0167618 | A1 | 6/2014 | Wang |
| 2014/0311713 | A1 | 10/2014 | Wu et al. |

OTHER PUBLICATIONS

S. Narayana, et al., "Heat Flux Manipulation With Engineering Thermal Materials," Physical Review Letters, 108 (2012) 214303.

Zain-ul-Abdein, et al., "Computational Investigation of Factors Affecting Thermal Conductivity in a Particulate Filled Composite Using Finite Element Method," International Journal of Engineering Science, 56 (2012) 86-98.

Guenneau, et al., Fick's Second Law Transformed: One Path of Cloaking in Mass Diffusion, Journal of Royal Society Interface, 2013—3-27.

Stark, "Not Your Average Heat Shield: New 'Thermal' Approach to Invisibility Cloaking Hides Heat to Enhance Technology," Physical Review Letters, Apr. 1, 2013.

Schittny, et al. "Experiments on Transformation Thermodynamics; Molding the Flow of Heat", Physical Review Letters, Apr. 1, 2013.

Han, et al. "Homogeneous Thermal Cloak With Constant Conductivity and Tunable Heat Localization," Scientific Reports, Apr. 3, 2013.

Xu, et al. "Experimental Demonstration of an Ultra-Thin Three-Dimensional Cloak," Pre-publication arxiv.org, Jun. 17, 2013.

Dede, et al., "Thermal-Composite Design Optimization for Heat Flux Shielding, Focusing and Reversal," Structural and Multidisciplinary Optimization, Jul. 4, 2013.

Han, et al., "Bilayer Isotropic Thermal Clock", Pre-publication arxiv.org., Jul. 8, 2013.

Dede, et al., "Heat Flux Cloaking, Focusing, and Reversal in Ultra-Thin Composites Considering Conduction-Convection Effects,", Applied Physics Letters, Aug. 8, 2013.

* cited by examiner

HEAT TRANSFER MANAGEMENT APPARATUSES HAVING A COMPOSITE LAMINA

CROSS-REFERENCE TO RELATED APPLICATIONS

The instant application is related to U.S. application Ser. No. 14/340,614, filed Jul. 25, 2014, and titled "Heat Transfer Management Apparatus Having a Composite Lamina," the entire disclosure of which is hereby incorporated by reference.

TECHNICAL FIELD

The present specification generally relates to heat transfer management apparatuses and, more particularly, heat transfer management apparatuses having a composite lamina with thermal conductor traces that steer heat flux.

BACKGROUND

In general, electrical components generate heat as a byproduct of the operation of the electrical components. However, an increase in generation of heat may be detrimental to performance and operation of electrical components. The heat generated by the operation of the electrical components, therefore, is rejected into the surrounding environment. In some applications, heat-sensitive electrical components may be located at positions in which heat from other electrical components adversely affects operation of the heat-sensitive electrical components.

Accordingly, heat transfer management apparatuses that affect the flow of thermal energy may be desired.

SUMMARY

In one embodiment, a heat transfer management apparatus includes a composite lamina having an insulator substrate and a plurality of thermal conductor traces coupled to the insulator substrate. The plurality of thermal conductor traces are arranged into a first enhanced thermal conduction region and a second enhanced thermal conduction region, where at least one of the plurality of thermal conductor traces in the first enhanced thermal conduction region extends in a direction that is transverse to at least one of the thermal conductor traces in the second enhanced thermal conduction region. The heat transfer management apparatus also includes a heat generating component mount and a temperature sensitive component mount in electrical continuity with the heat generating component mount and positioned distally from the heat generating component mount, where a shielding path projection extends from the heat generating component mount towards the temperature sensitive component mount, and at least one of the thermal conductor traces is transverse to the shielding path projection between the heat generating component mount and the temperature sensitive component mount to steer heat flux away from the temperature sensitive component mount.

In another embodiment, a heat transfer management apparatus includes a composite lamina having an insulator substrate and a plurality of thermal conductor traces coupled to the insulator substrate, where the plurality of thermal conductor traces are arranged into a first enhanced thermal conduction region and a second enhanced thermal conduction region. The heat transfer management apparatus also includes a heat generating component mount coupled to the composite lamina, a temperature sensitive component mount coupled to the composite lamina and positioned distally from the heat generating component mount, and a targeted heat rejection region positioned distally from the heat generating component mount. The heat transfer management apparatus further includes a shielding path projection that is positioned proximate to the first enhanced thermal conduction region and extends from the heat generating component mount towards the temperature sensitive component mount, and a focusing path projection that is positioned proximate to the second enhanced thermal conduction region and extends from the heat generating component towards the targeted heat rejection region at positions spaced apart from the shielding path projections. The thermal conductor traces are arranged relative to the insulator substrate to increase thermal conduction in a direction transverse to the shielding path projections in the first enhanced thermal conduction region to increase thermal conduction in the direction transverse to the shielding path projections, and the thermal conductor traces are arranged relative to the insulator substrate to increase thermal conduction in a direction generally parallel to the focusing path projections in the second enhanced thermal conduction region to increase thermal conduction in the direction of the focusing path projections.

In yet another embodiment, a heat transfer management apparatus includes a composite lamina comprising an insulator substrate and a plurality of thermal conductor traces coupled to the insulator substrate, where the plurality of thermal conductor traces are arranged into a first enhanced thermal conduction region and a second enhanced thermal conduction region, a heat generating component mount coupled to the composite lamina, a temperature sensitive component mount coupled to the composite lamina and positioned distally from the heat generating component mount, and a targeted heat rejection region positioned distally from the heat generating component mount. The heat transfer management apparatus also includes a shielding path projection that is positioned proximate to the first enhanced thermal conduction region and extends from the heat generating component mount towards the temperature sensitive component mount, and a focusing path projection is positioned proximate to the second enhanced thermal conduction region and extends from the heat generating component towards the targeted heat rejection region at positions spaced apart from the shielding path projections. The thermal conductor traces are arranged relative to the insulator substrate to provide an anisotropic thermal conduction along the composite lamina, in which the thermal conduction is increased in a direction transverse to the shielding path projection and increased in a direction parallel to the focusing path projection.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Reference will now be made in detail to embodiments of heat transfer management apparatuses that include features that direct the flow of heat along the heat transfer management apparatuses. The heat transfer management apparatuses include one or more composite lamina that each have an insulator substrate and a plurality of thermal conductor traces that are coupled to the insulator substrate. The thermal conductors direct the thermal energy along the composite lamina in a direction and/or at a rate that differs from the direction and/or rate of the heat flux along an isotropic insulator substrate. By providing composite lamina having thermal conductors and insulator substrates in anisotropic arrangements, thermal energy may be directed in a direction and/or at a rate that improves operation of the electrical components coupled to the composite lamina. Various embodiments of the heat transfer management apparatuses will be described in more detail herein.

Figure 1:
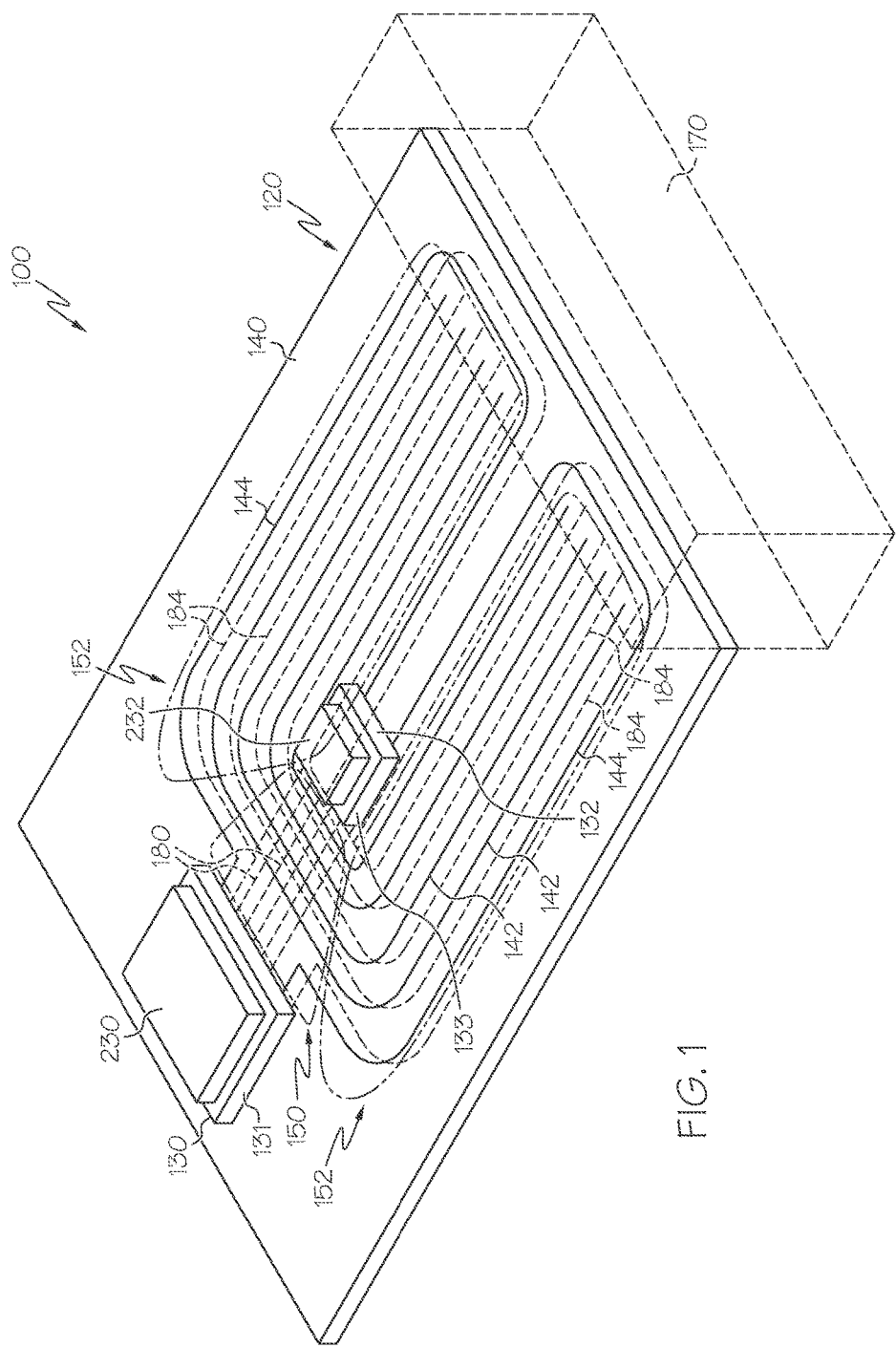
FIG. 1 schematically depicts a side perspective view of a heat transfer management apparatus having a composite lamina according to one or more embodiments shown or described herein.

Referring now to FIG. 1, one embodiment of a heat transfer management apparatus 100 is depicted. In this embodiment, the heat transfer management apparatus includes a composite lamina 120, which may act as an attachment substrate to which a variety of electrical components are attached. The heat transfer management apparatus 100 also includes a heat generating component mount 130 and a temperature sensitive component mount 132 that are both coupled to the composite lamina 120. The temperature sensitive component mount 132 is positioned distally from the heat generating component mount 130. A heat generating component 230 may be mounted to the heat transfer management apparatus 100 through attachment with the heat generating component mount 130. Similarly, a temperature sensitive component 232 may be mounted to the heat transfer management apparatus 100 through attachment with the temperature sensitive component mount 132.

In the embodiment depicted in FIG. 1, the heat generating component 230 may be an electronics device that produces heat as a byproduct of its operation. The heat generating component 230 may be a variety of electronic devices that include integrated circuits, for example, computer processing units, graphical processing units, chipsets, and the like. In some embodiments, the heat generating component 230 may be a semiconductor device such as those utilized in power inverters, voltage rectifiers, voltage regulators, and the like. Exemplary semiconductor devices include, but are not limited to, power insulated-gate bi-polar transistors, metal-oxide field-effect transistors, and the like. In operation, the heat generating component 230 generally produces heat as a waste byproduct of the designed operative function of the heat generating component 230. The heat produced by the heat generating component 230 in the heat transfer management apparatus 100 is generally undesired, as electrical components are conventionally susceptible to temperature malfunction or permanent failure if an over-temperature condition is realized. Nevertheless, the heat generating component 230 will continue to operate throughout a wide temperature band.

Additionally, in the embodiment depicted in FIG. 1, the temperature sensitive component 232 may be selected from a variety of a temperature sensitive electronic devices including, for example planar coupler, an inductor/transformer, a high-Q resonator, a detector, a current sensing resistor, a crystal oscillator, an aligned optical component, or a human interface control button. Operation of the temperature sensitive component 232 may be adversely affected by thermal energy that is generated by the heat generating component 230. Accordingly, to manage the temperature of temperature sensitive components 232 coupled to the composite lamina 120, the composite lamina 120 includes heat transfer management features that modify the direction and/or intensity of the heat flux that flows along the composite lamina 120.

In the embodiment depicted in FIG. 1, the composite lamina 120 includes an insulator substrate 140 and thermal conductor traces 142 that are coupled to the insulator substrate 140. The thermal conductor traces 142 may be selected from any of a variety of materials having high thermal conduction properties, including, for example, copper, silver, gold, graphite, graphene, or other carbon-based conductors. The thermal conductor traces 142 may have a thermal conductivity, $k_c$, that is greater than the thermal conductivity of the insulator substrate 140, $k_i$. In some embodiments, k is at least an order of magnitude greater than $k_i$. The insulator substrate 140 may be selected from any of a variety of materials having low electronic conductivity, including, for example, plastics such as polypropylene, polyester, nylon, epoxy and the like, which may be combined with carbon or glass reinforcement. In one embodiment, the insulator substrate 140 may be made from FR-4, which is a glass-reinforced epoxy. The insulator substrate 140 has a thermal conductivity, $k_i$, that is less than the thermal conductivity of the thermal conductor traces 142, $k_c$. In some embodiments, the composite lamina 120 may be printed circuit boards that are fabricated according to conventional manufacturing techniques. In some embodiments, the thermal conductor traces 142 are at least partially embedded in the insulator substrate 140.

In the depicted embodiment, the thermal conductor traces 142 are generally spaced apart from one another, so that the thermal conductor traces 142 are isolated from contact with one another by insulator substrate 140. Because of the separation from one another by the insulator substrate 140, the thermal conductor traces 142 may be thermally isolated from one another, such that heat flux is more likely to be conducted along the length of the thermal conductor traces 142 than in directions transverse to the length of the thermal conductor traces 142. Determination of whether the thermal conductor traces 142 are thermally isolated from one another may be based on the thermal conductor traces 142 being electrically isolated from one another, such that the arrangement of thermal conductor traces 142 and insulator substrate 140 prevents the thermal conductor traces 142 within each of the composite lamina 120 from being in electrical continuity with one another.

Still referring to FIG. 1, the arrangement of the heat generating component mount 130 and the temperature sensitive component mount 132 are arranged relative to one another to define a plurality of shielding path projections 180 that extend from the heat generating component mount 130 towards the temperature sensitive component mount 132. In the embodiment depicted in FIG. 1, a plurality of shielding path projections 180 extend from the perimeter 131 of the heat generating component mount 130 to the perimeter 133 of the temperature sensitive component mount 132. In the embodiment depicted in FIG. 1, the shielding path projections 180 extend from the plurality of shielding path projections 180 are representative of the general direction of the flow of heat flux through an isotropic substrate between the heat generating component mount 130 to the temperature sensitive component mount 132. The heat transfer management apparatus 100 may also include a plurality of focusing path projections 184 that extend away from the heat generating component mount 130. The heat generating component mount 130 and the temperature sensitive component mount 132 may be positioned such that the focusing path projections 184 generally do not overlap the shielding path projections 180. In some embodiments of the heat transfer management apparatus 100, the thermal conductor traces 142 may be positioned to be generally aligned with and parallel to the focusing path projections 184. In some embodiments, portions of the thermal conductor traces 142 may be generally aligned with and parallel to the focusing path projections 184 at positions spaced apart from the shielding path projections 180.

As depicted in FIG. 1, a plurality of thermal conductor traces 142 are positioned transverse to the shielding path projections 180 that extend from the heat generating component mount 130 to the temperature sensitive component mount 132. In some embodiments, the thermal conductor traces 142 are perpendicular to some or all of the shielding path projections 180 that extend from the heat generating component mount 130 to the temperature sensitive component mount 132. The thermal conductor traces 142 positioned proximate to the shielding path projections 180 are arranged into a first enhanced thermal conduction region 150. The thermal conductor traces 142 that are positioned distally from the shielding path projections 180 are arranged into a second enhanced thermal conduction region 152.

The thermal conductor traces 142 in this location modify the heat flux from the heat generating component 230 to the temperature sensitive component 232. Because the thermal conductor traces 142 have higher thermal conductivity than the insulator substrate 140, heat energy generated by the heat generating component 230 that is coupled to the heat generating component mount 130 may tend to be directed along the thermal conductor traces 142 and transverse to the shielding path projections 180 between the heat generating component mount 130 to the temperature sensitive component mount 132. By directing the heat flux transverse to the shielding path projections 180, the introduction of heat from the heat generating component 230 into the temperature sensitive component mount 132 (and therefore the temperature sensitive component 232) may be minimized. Instead, heat generated by the heat generating component 230 is directed along the thermal conductor traces 142 away from the shielding path projections 180 into the second enhanced thermal conduction regions 152, where the heat flux may be directed away from the temperature sensitive component mount 132.

Still referring to FIG. 1, a plurality of the thermal conductor traces 142 may be arranged in a nested array configuration relative to one another, such that the plurality of thermal conductor traces 142 are generally concave around the temperature sensitive component mount 132. The plurality of thermal conductor traces 142 arranged into the nested array generally have path lengths evaluated within the first enhanced thermal conduction region 150 in which the thermal conductor traces 142 positioned proximate to the temperature sensitive component mount 132 are less than path lengths of the thermal conductor traces 142 that are positioned distally from the temperature sensitive component mount 132. The orientation of the nested array of the thermal conductor traces 142 may reduce heat flux across the thermal conductor traces 142. Instead, heat flux may be directed along the lengths of the thermal conductor traces 142, such that the heat flux can be steered away from the temperature sensitive component mount 132 and towards an element of the heat transfer management apparatus that is targeted to heat rejection.

A subset of thermal conductor traces 142 within the laminate assembly 110 may be placed into electrical continuity with the heat generating component mount 130 and/or the temperature sensitive component mount 132. This subset of thermal conductor traces 142 may be identified as electrical conductors 144. The electrical conductors 144 in electrical continuity with the heat generating component mount 130 and/or the temperature sensitive component mount 132 may deliver power to the associated heat generating component mount 130 and/or the temperature sensitive component mount 132, and/or may deliver electrical signals to the heat generating component mount 130 and/or the temperature sensitive component mount 132. The electrical conductors 144 may convey both electricity and heat along their lengths.

The thermal conductor traces 142, including the electrical conductors 144, may be positioned within the composite lamina 120 to steer the direction of heat flux along the composite lamina 120. Without being bound by theory, heat flux tends to "diffuse" in all directions from a high-temperature region towards a low temperature region. Through placement of the thermal conductor traces 142 in the insulator substrate 140, heat flux can be preferentially directed along the thermal conductor traces 142, modifying the pattern of diffusion of heat. By controlling the direction of heat flux along the laminate assembly 110, temperature increase of temperature sensitive components 232 mounted to the laminate assembly 110 can be minimized, thereby enhancing performance of the temperature sensitive components 232 by minimizing unwanted heat flux from being transferred to the temperature sensitive components 232. Additionally, the thermal conductor traces 142 that are electrically isolated from at least one of the heat generating component mount 130 or the temperature sensitive component mount 132 may conduct more heat flux than the electrical conductor 144 that is in electrical continuity with the heat generating component mount 130 and the temperature sensitive component mount 132.

Still referring to FIG. 1, the heat transfer management apparatus 100 may include a targeted heat rejection region 170 of the composite lamina 120. In the embodiment depicted in FIG. 1, targeted heat rejection region 170 is a free convection region of the composite lamina 120 through which heat is rejected into the surrounding environment. Heat flux that is directed along the thermal conductor traces 142 may be conducted towards the targeted heat rejection region 170 and into the surrounding environment, thereby decreasing the heat that remains in the heat transfer management apparatus 100. In some embodiments, the targeted heat rejection region 170 may include a heat sink 172 that is adapted to reject the heat flux into the surrounding environment. Heat flux that flows along the thermal conductor traces 142 from the heat generating component mount 130 towards the heat sink 172 may be conducted at a rate greater than a conventional composite lamina, such that the portions of the thermal conductor traces 142 regions positioned generally between the heat generating component mount 130 and the heat sink 172 define a second enhanced thermal conduction region 152. In these regions, the conductive heat transfer evaluated from the heat generating component mount 130 to the heat sink 172 is greater than the conductive heat transfer flowing through insulator substrate 140 along an equivalent direction.

Because heat flux may be directed along all of the thermal conductor traces 142, including the electrical conductors 144, the electrical conductors 144 may direct some heat flux from the heat generating component mount 130 to the temperature sensitive component mount 132. However, because of the arrangement of the plurality of thermal conductor traces 142 into the second enhanced thermal conduction region 152 and the first enhanced thermal conduction region 150, the flow of heat flux along the composite lamina 120 may be primarily directed along the insulator substrate 140 and the thermal conductor traces 142 that are not the electrical conductors 144. Because the electrical conductors 144 account for a minority of conductive heat flow along the composite lamina 120, the conductive heat flow along the composite lamina 120 may be effectively steered by the arrangement of the electrical conductors 144 along the insulator substrate 140 according to heat management requirements of a particular end-user application. In the embodiment depicted in FIG. 1, the heat flux may be steered away from the temperature sensitive component mount 132 so that heat flux introduced to the temperature sensitive component 232 coupled to the temperature sensitive component mount 132 may be minimized.

Figure 2:
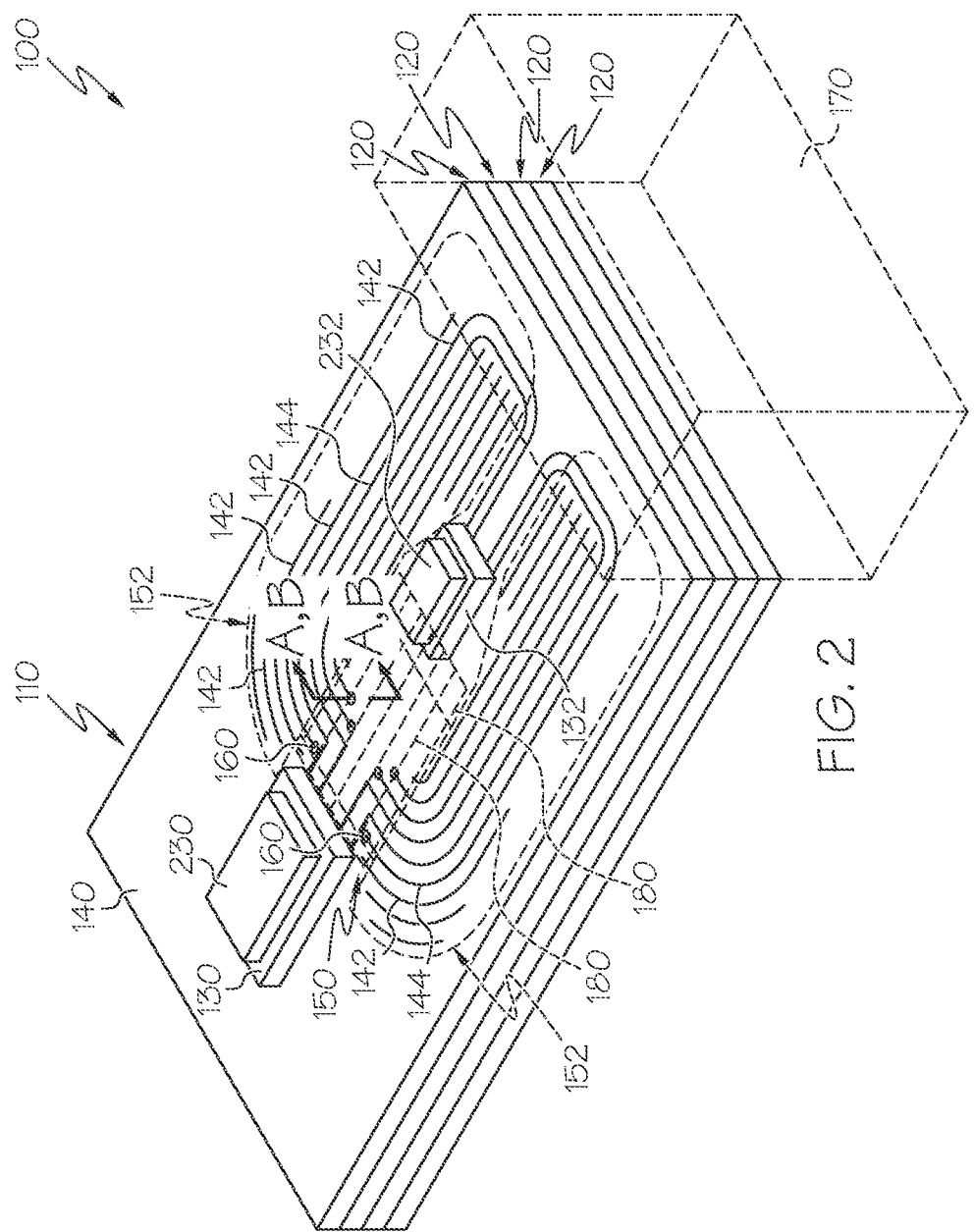
FIG. 2 schematically depicts a side perspective view of a composite lamina of a heat transfer management apparatus according to one or more embodiments shown or described herein.

Referring now to FIG. 2, heat transfer management apparatus 100 having a laminate assembly 110 that includes a plurality of composite laminae 120 is depicted. The laminate assembly 110 is depicted with the composite lamina 120 in an exploded state in FIG. 3. Similar to the embodiment of the composite lamina 120 described above with reference to FIG. 1, the embodiment of the laminate assembly 110 of the embodiment depicted in FIG. 2 may include a plurality composite lamina 120 that each include a plurality of thermal conductor traces 142 that are coupled to an insulator substrate 140 in an arrangement that steers heat flux according to requirements of a particular end-user application. In the embodiment depicted in FIG. 2, the thermal conductor traces 142 are arranged relative to the insulator substrate 140 into first enhanced thermal conduction regions 150 between the heat generating component mount 130 and the temperature sensitive component mount 132, and into enhanced thermal conduction regions 152 at positions outside of the first enhanced thermal conduction regions 150. By modifying the conductive heat transfer across a plurality of composite laminae 120 that form the laminate assembly 110, the heat transfer along the heat transfer management apparatus 100 may be targeted to provide a desired temperature profile along the plurality of composite laminae 120.

Figure 3:
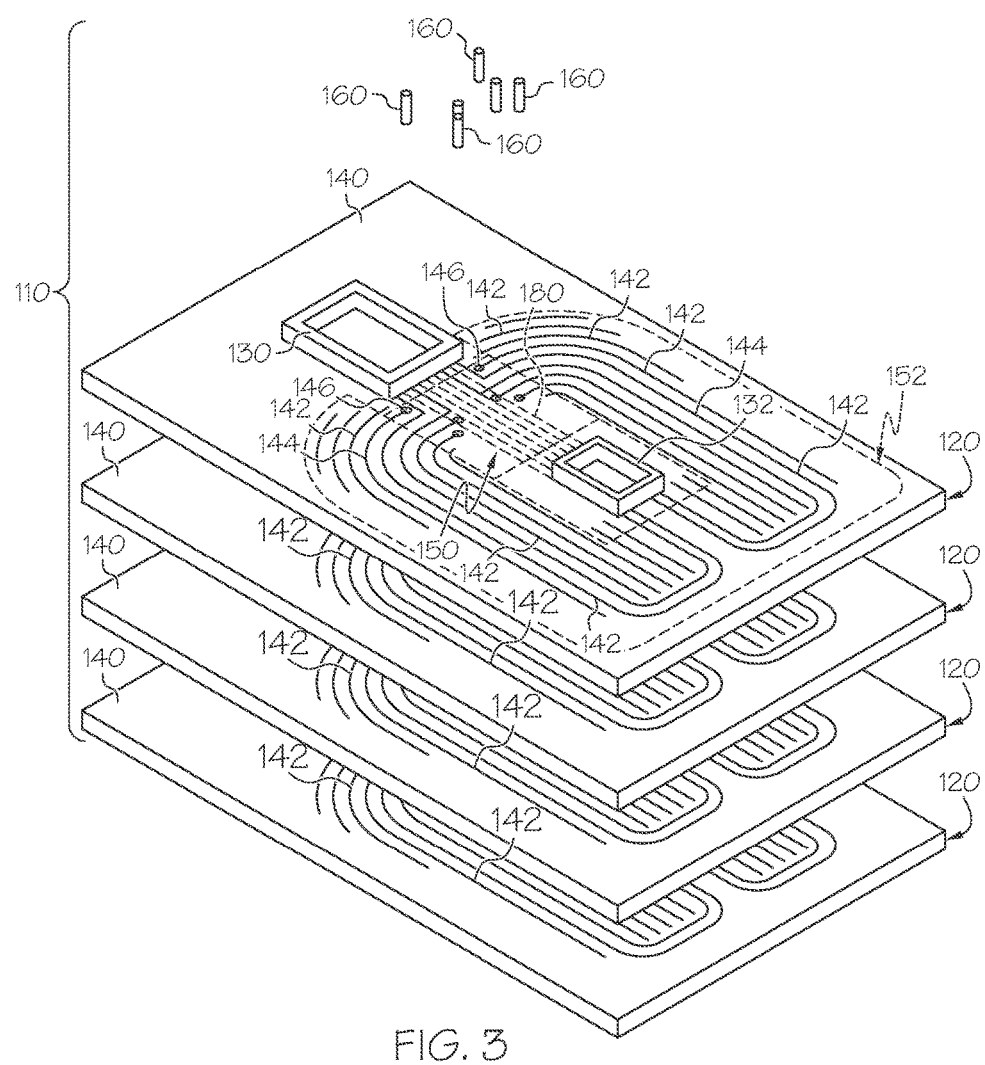
FIG. 3 schematically depicts an exploded side perspective view of a heat transfer management apparatus having a plurality of composite laminae according to one or more embodiments shown or described herein.

Referring now to FIG. 3, the composite laminae 120 of the laminate assembly 110 are depicted in an exploded state. Each of the composite lamina 120 may include a thermal conductor trace 142 that is coupled to the insulator substrate 140. In the depicted embodiment, each of the composite laminae 120 of the laminate assembly 110 have thermal conductor traces 142 that are arranged relative to the insulator substrate 140 into similar or identical patterns relative to the heat generating component mount 130 and the temperature sensitive component mount 132. However, it should be understood that some embodiments of laminate assemblies 110 may include thermal conductor traces 142 and insulator substrate 140 that are arranged into different or dissimilar configurations across different composite laminae 120.

Referring collectively to FIGS. 2 and 3, the first enhanced thermal conduction region 150 may reduce heat flux from being directed in a first direction from the heat generating component mount 130 towards the temperature sensitive component mount 132. By increasing the heat transfer along the thermal conductor traces 142 as compared to the insulator substrate 140, the direction of flow of heat flux can be at least partially controlled such that the layout of the thermal conductor traces 142 and the insulator substrate 140 steer the heat flux along the thermal conductor traces 142. In certain layouts of the thermal conductor traces 142 and the insulator substrate 140, by steering the heat flux away from the temperature sensitive component mount 132, operation of the temperature sensitive component 232 may be enhanced. The thermal conductivity of the laminate assembly 110 evaluated in the first direction from the heat generating component mount 130 to the temperature sensitive component mount 132 across the first enhanced thermal conduction region 150 may be less than the thermal conductivity of the insulator substrate 140.

Still referring to FIGS. 2 and 3, the embodiment of the laminate assembly 110 may include a plurality of composite laminae 120 that each have thermal conductor traces 142 and insulator substrate 140. In at least one of the composite lamina 120, the thermal conductor traces 142 and the insulator substrate 140 may be arranged into first enhanced thermal conduction regions 150 and enhanced thermal conduction regions 152. As discussed hereinabove, the first enhanced thermal conduction regions 150 may preferentially steer heat flux away from the first direction between the heat generating component mount 130 and the temperature sensitive component mount 132. The second enhanced thermal conduction regions 152 may increase heat flux along the laminate assembly 110 at positions outside of the first enhanced thermal conduction regions 150. In the embodiment depicted in FIGS. 2 and 3, the second enhanced thermal conduction region 152 may steer heat flux away from the temperature sensitive component mount 132 to reduce the temperature of the temperature sensitive component 232.

The plurality of composite laminae 120 may, through conduction of heat flux through the thermal conductor traces 142 and the insulator substrate 140, modify the heat flux by preferentially directing heat flux through the thickness of the laminate assembly 110. By incorporating multiple composite lamina 120, each having first enhanced thermal conduction regions 150 and enhanced thermal conduction regions 152, into the laminate assembly 110, the effects of shielding and concentrating heat flux between the heat generating component 230 and the temperature sensitive component 232 may be enhanced as compared with a single composite lamina 120. Such laminate assemblies 110 may simultaneously manage heat transfer through the plurality of composite laminae 120. Accordingly, a laminate assembly 110 having a plurality of composite laminae 120 may manage the conduction of heat flux with greater control than a single composite lamina 120 having first enhanced thermal conduction regions 150 and enhanced thermal conduction regions 152.

In some embodiments, the arrangement of thermal conductor traces 142 in the insulator substrate 140 may be uniform across all of the composite lamina 120. In other embodiments, the thermal conductor traces 142 may be selectively positioned across each of the composite lamina 120 for efficient usage of thermal conductor traces 142 in managing heat flux between the heat generating component 230 and the temperature sensitive component 232. For example, in some embodiments, fewer thermal conductor traces 142 may be positioned in a composite lamina 120 that is positioned distally from the heat generating component 230 as compared to a composite lamina 120 positioned proximate to the heat generating component 230. Such arrangements may account for the tendency for heat flux to diffuse through insulator substrate 140, thereby minimizing the effect of some portions of the thermal conductor traces 142 positioned within composite lamina 120 that are positioned distally from the heat generating component 230.

In some embodiments, the thermal conductor traces 142 positioned along different composite lamina 120 may be electrically coupled to one another with vias 160 that extend through at least a partial thickness of one of the composite lamina 120. The vias 160 may be made of a material that is a thermal conductor. In some embodiments, the vias 160 may be made from the same material as the thermal conductor traces 142. In some embodiments, the vias 160 may have thermal conductivity that is approximately equivalent as the thermal conductivity of the thermal conductor traces 142. In some embodiments, the vias 160 may conduct both heat flux and electrical energy from one composite lamina 120 to another composite lamina 120. In the embodiment depicted in FIG. 4, each of the composite lamina 120a, 120b, 120c, 120d include thermal conductor traces 142 that extend to positions proximate to the vias 160 such that the thermal conductor traces 142 along each of the plurality of composite laminae 120 may be in thermal continuity with the vias 160, and therefore each of the thermal conductor traces 142 may be in thermal continuity with one another.

Figure 4:
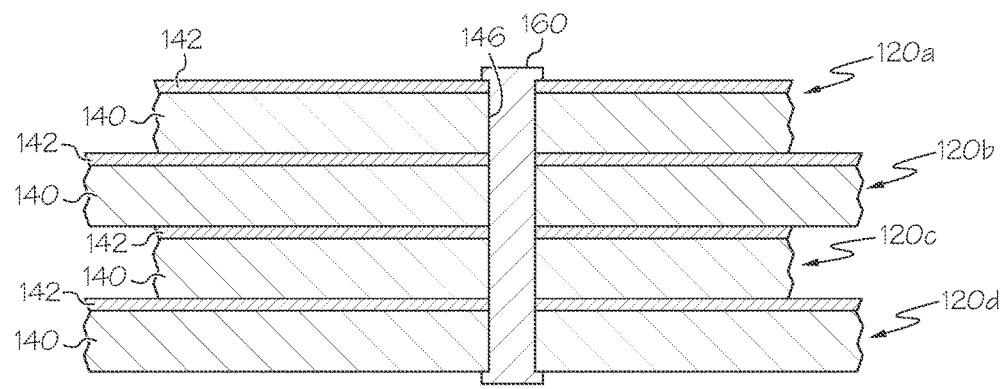
FIG. 4 schematically depicts a side sectional view of the heat transfer management apparatus of FIG. 2 shown along line A-A.

In the embodiment depicted in FIG. 4, a plurality of vias 160 extend through the plurality of composite laminae 120a, 120b, 120c, 120d. The vias 160 are positioned to intersect thermal conductor traces 142 that are positioned along different composite lamina 120. For example, as depicted in FIG. 4, the vias 160 extend from the upper-most composite lamina 120a, through the intermediate composite laminae 120b, 120c, and to the lower-most composite lamina 120d. In the depicted embodiment, the vias 160 are positioned to contact the thermal conductor traces 142 that are positioned along different composite lamina 120, so that the thermal conductor traces 142 positioned along different composite lamina 120 are placed into thermal conductivity with one another.

Figure 5:
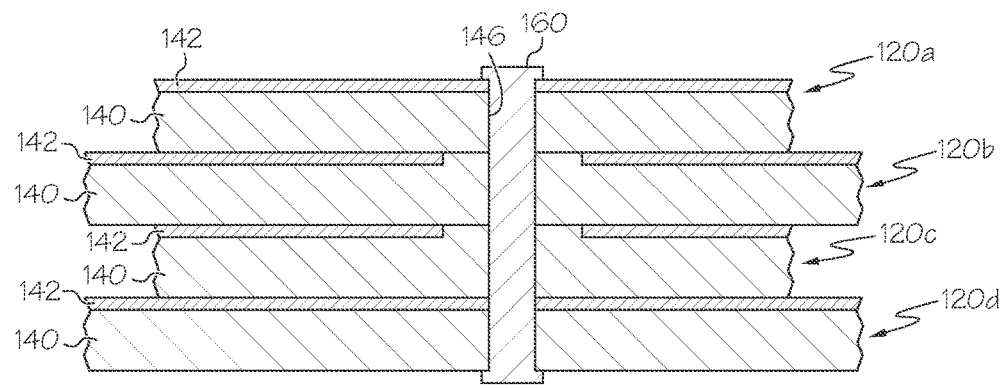
FIG. 5 schematically depicts a side sectional view of the heat transfer management apparatus of FIG. 2 shown along line B-B.

In contrast to the embodiment depicted in FIG. 4, in the embodiment depicted in FIG. 5, the vias 160 are in contact with the thermal conductor traces 142 of the upper-most composite lamina 120a and the lower-most composite lamina 120d. The vias 160 place the thermal conductor traces 142 of the upper-most composite lamina 120a into thermal conductivity with the thermal conductor traces 142 of the lower-most composite lamina 120d. Because the via 160 is an efficient conductor of heat flux, heat flux generated proximate to the upper-most composite lamina 120a (for example, at the heat generating component 230) may be conducted along the via 160 from the upper-most composite lamina 120a to the thermal conductor traces 142 of the lower-most composite lamina 120d. The heat flux, therefore, may be steered by the thermal conductor traces 142 that are positioned along composite lamina 120 that are spaced apart from the heat generating component 230 of the heat transfer management apparatus 100.

By steering the heat flux with the thermal conductor traces 142 that are positioned proximate to different composite lamina 120 than the composite lamina 120 to which the heat generating component 230 and the temperature sensitive component 232 are coupled, the heat flux that is introduced to the temperature sensitive component 232 from the heat generating component 230 may be minimized.

Referring again to FIGS. 2 and 3, the electrical conductors 144, which are a subset of the thermal conductor traces 142, may be positioned in composite lamina 120 in which electrical continuity between the heat generating component 230 and the temperature sensitive component 232 is needed. In the embodiment depicted in FIG. 2, the electrical conductors 144 are positioned in the upper-most composite lamina 120a of the laminate assembly 110. The remaining composite lamina 120 in the laminate assembly 110 are free from electrical conductors 144. Other embodiments of the laminate assembly 110 having electrical conductors 144 positioned in other composite lamina 120 will be described in more detail below. Embodiments of the laminate assembly 110 according to the present disclosure may incorporate thermal conductor traces 142 and electrical conductors 144 into the composite lamina 120 with one another. By incorporating thermal conductor traces 142 that are electrically isolated from the electrical conductors 144, the laminate assembly 110 simultaneously maintains electrical continuity between electrical components coupled to the laminate assembly 110 (i.e., the heat generating component 230 and the temperature sensitive component 232) while managing heat flux along the laminate assembly 110. Further, because the electrical conductors 144 conduct heat, the configuration of the thermal conductor traces 142 across each of the plurality of composite laminae 120 may dominate the heat flux that is directed through the electrical conductors 144, so that the overall heat flux along the laminate assembly 110 satisfies design criterion.

Still referring to the embodiment depicted in FIGS. 2 and 3, the thermal conductor traces 142 that are electrically isolated from the heat generating component mount 130 and the temperature sensitive component mount 132 are positioned such that effect of the heat flux directed along the electrical conductors 144 is minimized as compared to the heat flux that is preferentially directed along the thermal conductor traces 142. In the embodiment depicted in FIGS. 2 and 3, at intermediate positions between the heat generating component mount 130 and the temperature sensitive component mount 132, the thermal conductor traces 142 are positioned closer to the temperature sensitive component mount 132 than the electrical conductors 144, which are in electrical continuity with the temperature sensitive component mount 132. By positioning the thermal conductor traces 142 closer to the temperature sensitive component mount 132, the effect of heat flux that diffuses from the electrical conductors 144 towards the temperature sensitive component mount 132 may be minimized. Additionally, as depicted in the embodiment of FIGS. 2 and 3, at least one of the electrical conductors 144 that is in electrical continuity with the heat generating component mount 130 and/or the temperature sensitive component mount 132 may have a greater path length that the thermal conductor traces 142 that are electrically isolated from the temperature sensitive component mount 132. Similarly, the thicknesses of the thermal conductor traces 142 may be greater than the thicknesses of the electrical conductors 144. By modifying the path length and/or the thicknesses of the electrical conductors 144 as compared to the thermal conductor traces 142, the resistance to thermal conduction of the electrical conductor 144 may increase as compared to the thermal conductor traces 142, such that less heat flux may be directed along the electrical conductor 144 as compared to the thermal conductor traces 142.

Referring to FIGS. 1-3, heat transfer management apparatuses 100 according to the present disclosure may incorporate anisotropic arrangements of the thermal conductor traces 142 within the insulator substrate 140 to effectively steer heat flux along the laminate assembly 110 in a directional manner. For example, in the embodiments depicted in FIGS. 1-3, the arrangement of the thermal conductor traces 142 and the electrical conductors 144 effectively steers the heat flux according to a particular design, here, to minimize heat flux introduced to the temperature sensitive component mount 132 from the heat generating component mount 130. The directionality of the heat flux may be caused by the anisotropic arrangement of the thermal conductor traces 142 that increase the heat flux in one direction and decrease the heat flux in a second direction.

In the embodiment depicted in FIGS. 1-3, the anisotropic arrangement may be evaluated around the temperature sensitive component mount 132. As exhibited in the depicted embodiment, the thermal conductor traces 142 are arranged in an anisotropic arrangement around the temperature sensitive component mount 132 and between the heat generating component mount 130 and the temperature sensitive component mount 132. In the embodiment depicted in FIGS. 2 and 3, each of the composite lamina 120 includes no circular or polar symmetry of the thermal conductor traces 142 evaluated around the temperature sensitive component mount 132. Because each the composite lamina 120 of the laminate assembly 110 of FIGS. 2 and 3 has a similar arrangement of thermal conductor traces 142, the laminate assembly 110 has no cylindrical or spherical symmetry evaluated around the temperature sensitive component mount 132. Accordingly, the anisotropic arrangement of the thermal conductor traces 142 in the insulator substrate 140 maintains direction heat flux along the laminate assembly 110.

Embodiments of the composite lamina 120 having thermal conductor traces 142 at least partially embedded in the insulator substrate 140 are generally described herein, with respect to the effects of the thermal conductor traces 142 and the insulator substrate 140 on steady-state heat transfer along the heat transfer management apparatus 100. It should be understood, however, that the particular material used as the thermal conductor traces 142 and the dimensions of the thermal conductor traces 142 relative to the insulator substrate 140 may be modified to accommodate the thermal capacitance of the heat transfer management apparatus 100, thereby managing the transient thermal response of the heat transfer management apparatus 100.

Figure 6:
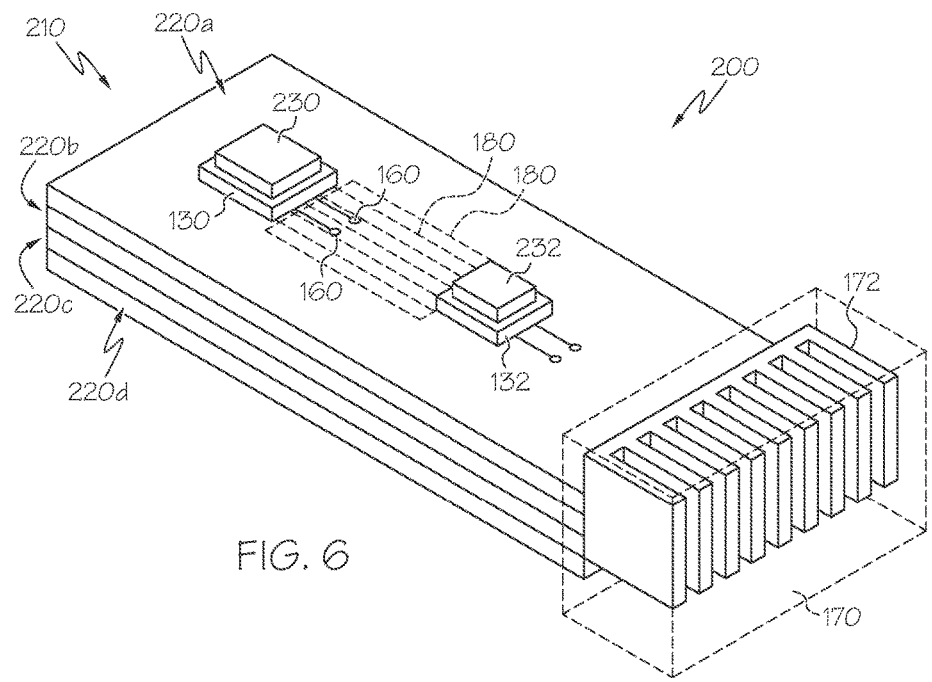
FIG. 6 schematically depicts a side perspective view of a heat transfer management apparatus having a plurality of composite laminae according to one or more embodiments shown or described herein.
Figure 7:
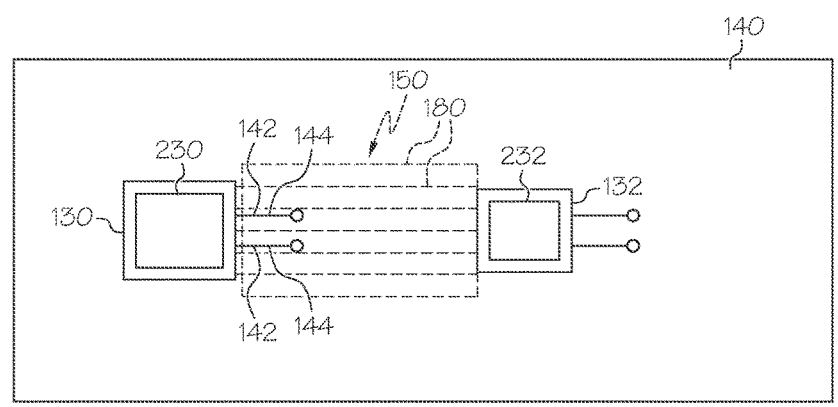
FIG. 7 schematically depicts a top view of a heat transfer management apparatus having a plurality of composite laminae according to one or more embodiments shown or described herein.
Figure 8:
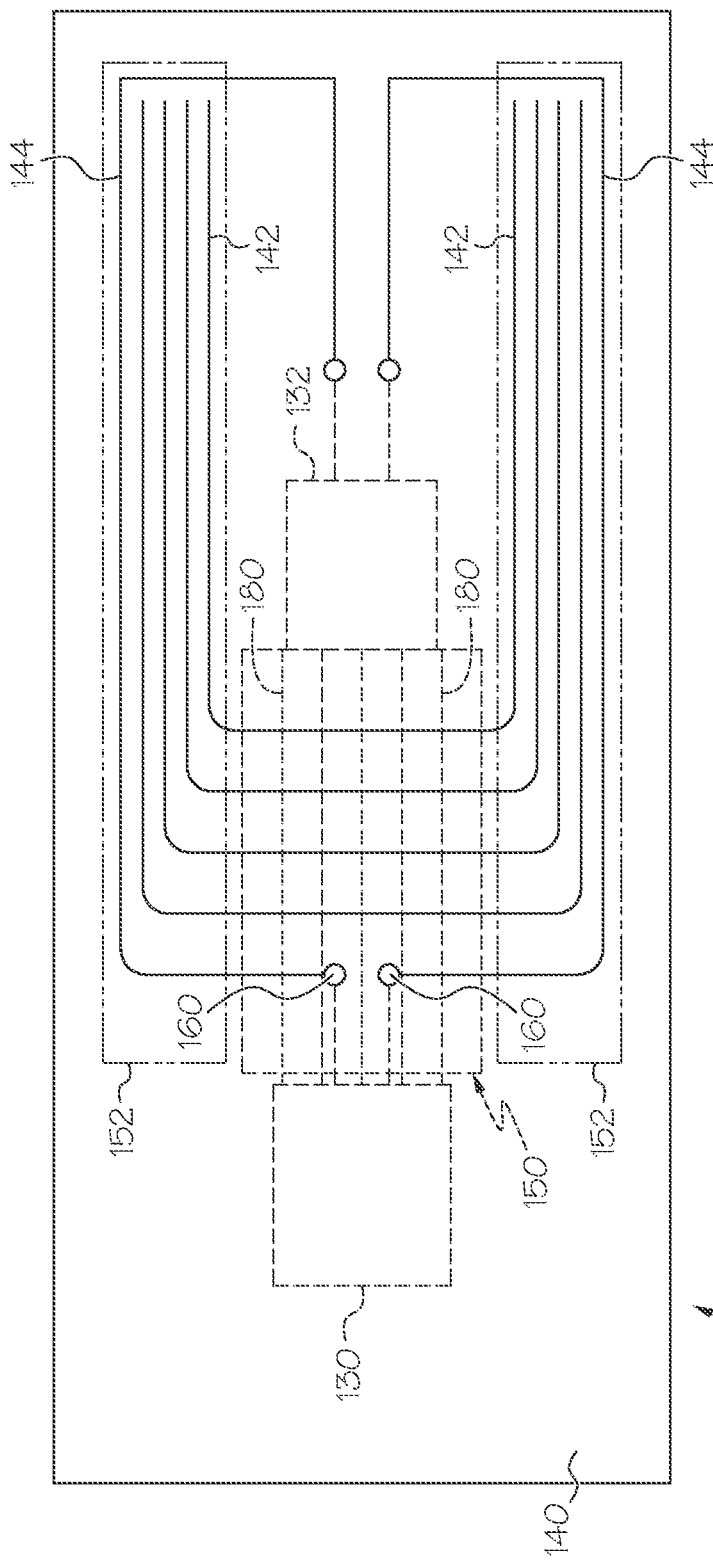
FIG. 8 schematically depicts a top view of a heat transfer management apparatus having a plurality of composite laminae according to one or more embodiments shown or described herein.

Referring now to FIGS. 6-8, another embodiment of the heat transfer management apparatus 200 is depicted. In this embodiment, the heat transfer management apparatus 200 includes a plurality of composite laminae 220 that are coupled together in a laminate assembly 210. The plurality of composite laminae 220 include an insulator substrate 140 and thermal conductor traces 142 that are arranged to steer heat flux along the composite laminae 220 and away from the temperature sensitive component mount 132. The arrangement of the insulator substrate 140 and the thermal conductor traces 142 may direct heat flux from the heat generating component 230 towards a targeted heat rejection region 170 (shown in the depicted embodiment as including a heat sink 172), while minimizing the direction of heat flux into the temperature sensitive component 232.

Various composite laminae 220a, 220d of the laminate assembly 210 are depicted in FIGS. 7 and 8, respectively. Referring to FIG. 7, one embodiment of the composite lamina 220a includes a heat generating component mount 130 and a temperature sensitive component mount 132 to which a heat generating component 230 and a temperature sensitive component mount 232, respectively, are coupled. The composite lamina 220a also includes a plurality of thermal conductor traces 142 that are coupled to an insulator substrate 140. As depicted, the composite lamina 220a includes a plurality of thermal conductor traces 142 that extend a portion of a distance between the heat generating component mount 130 and the temperature sensitive component mount 132. The plurality of thermal conductor traces 142 are terminated at through-holes 146 that extend through the remaining thickness of the insulator substrate 140. Vias 160, as discussed hereinabove, are positioned within the through-holes 146 and extend away from the composite lamina 220a.

Referring now to FIG. 8, another of the composite lamina 220d that forms the laminate assembly 210 is depicted. In the depicted embodiment, the composite lamina 220d includes a plurality of thermal conductor traces 142 that are coupled to the insulator substrate 140. The plurality of thermal conductor traces 142 in the composite lamina 220d are positioned transverse to the shielding path projections 180 between the heat generating component mount 130 to the temperature sensitive component mount 132 of the upper-most composite lamina 220a (compare FIGS. 6-8). By incorporating the plurality of thermal conductor traces 142 into a composite lamina 220d that is spaced apart from the heat generating component mount 130 to the temperature sensitive component mount 132 of the upper-most composite lamina 220a, heat flux from the heat generating component 230 may be directed to flow along composite lamina 220 that are thermally isolated from the temperature sensitive component 232, thereby minimizing the heat that is directed to the temperature sensitive component 232. Instead of heat flux being freely conducted along the upper-most composite lamina 220a, heat flux is directed along the vias 160 to composite lamina 220 that are positioned distally from the temperature sensitive component 232. Further, in certain embodiments of the laminate assembly 210, the thermal conductor traces 142 of each of the composite lamina 220 are separated by insulator substrate 140. In these embodiments, the insulator substrate 140 breaks any thermal continuity of the thermal conductor traces 142 across the thickness of the laminate assembly 210. Therefore, heat flux may be impeded from flowing between composite lamina 220 that form the laminate assembly 210.

Figure 9:
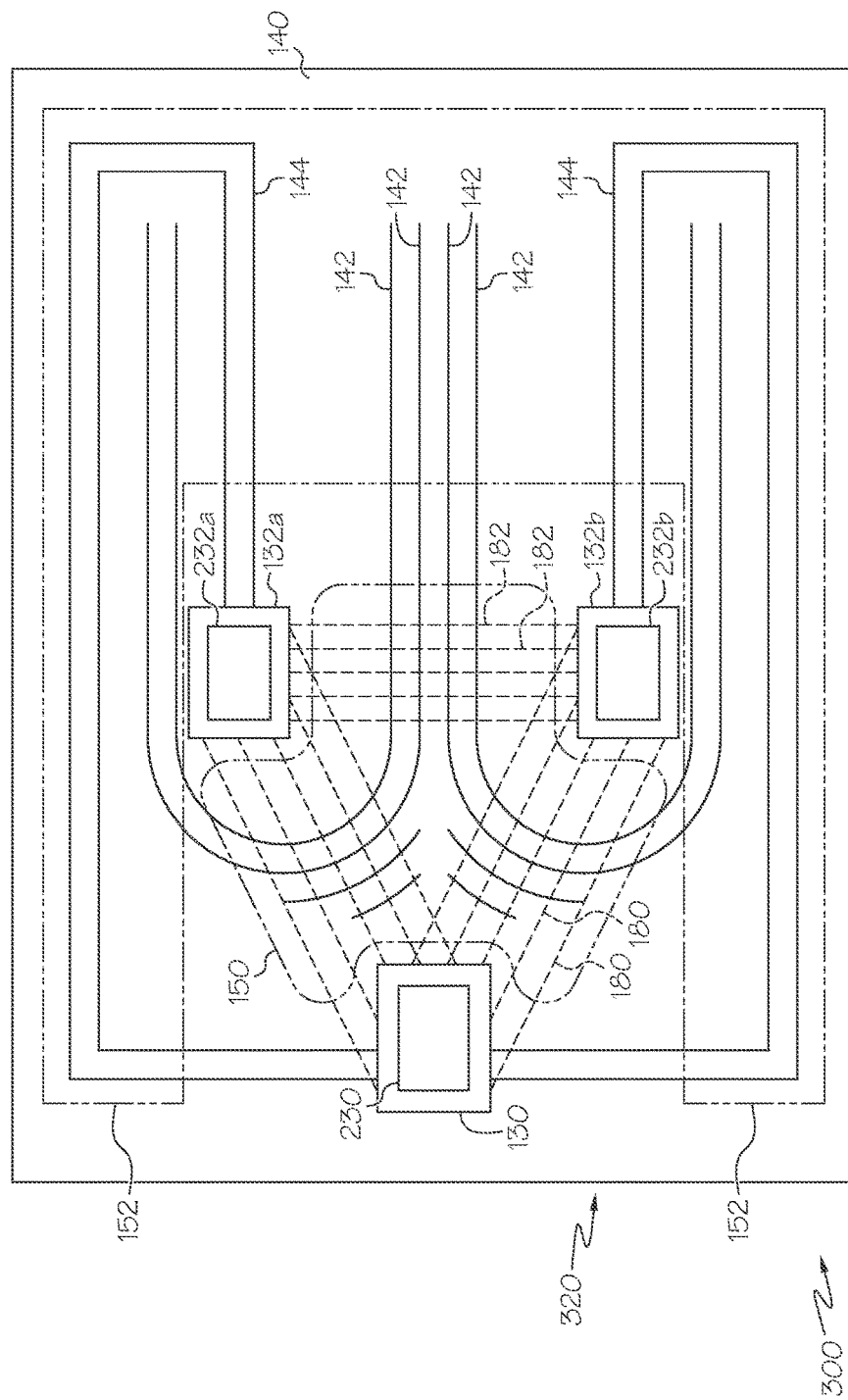
FIG. 9 schematically depicts a top view of a heat transfer management apparatus having a plurality of composite laminae according to one or more embodiments shown or described herein.

Referring now to FIG. 9, another embodiment of a heat transfer management apparatus 300 having a composite lamina 320 is depicted. In this embodiment, the heat transfer management apparatus 300 includes a heat generating component 230 coupled to a heat generating component mount 130, a first temperature sensitive device 232a coupled to a first temperature sensitive component mount 132a, and a second temperature sensitive device 232b coupled to a second temperature sensitive component mount 132b. Similar to the embodiments described hereinabove, the heat generating component 230 produces heat during its operation. The heat produced by the heat generating component 230 is rejected into the surrounding environment.

To minimize the amount of heat that is transferred to the first and second temperature sensitive component mounts 132a, 132b, a plurality of thermal conductor traces 142 are coupled to the insulator substrate 140. The plurality of thermal conductor traces 142 are arranged into first enhanced thermal conduction regions 150 between the heat generating component mount 130 and the first and second temperature sensitive component mount 132a, 132b, and between the first and second temperature sensitive component mounts 132a, 132b themselves. The thermal conductor traces 142 are positioned transverse to the shielding path projections 180 that extend between the heat generating component mount 130 and the first and second temperature sensitive component mounts 132a, 132b. Additionally, the composite lamina 320 includes a plurality of thermal conductor traces 142 that are positioned transverse to intermediate shielding path projections 182 that extend between the first and second temperature sensitive component mount 132a, 132b. At positions spaced apart from the shielding path projections 180 and the intermediate shielding path projections 182, the thermal conductor traces 142 are arranged into enhanced thermal conduction regions 152. The thermal conductor traces 142 may steer heat flux along the thermal conductor traces 142 and steer the heat flux in directions generally away from the temperature sensitive component mounts 132 and towards locations where the heat flux may be rejected into the surrounding environment, for example towards heat sinks (not shown).

Figure 10:
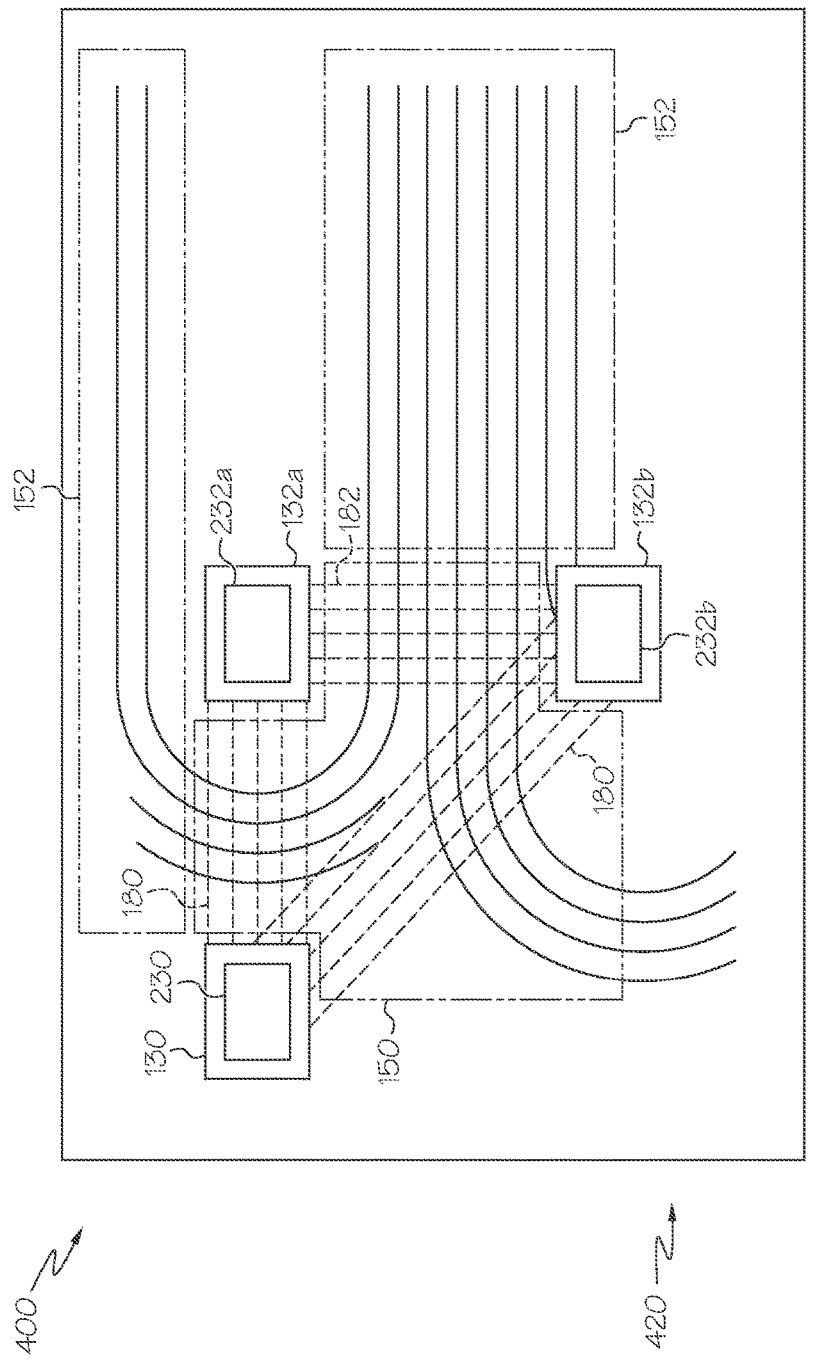
FIG. 10 schematically depicts a top view of a heat transfer management apparatus having a plurality of composite laminae according to one or more embodiments shown or described herein.

Referring now to FIG. 10, another embodiment of a heat transfer management apparatus 400 having a composite lamina 420 is depicted. In this embodiment, the heat transfer management apparatus 400 includes a heat generating component 230 coupled to a heat generating component mount 130, a first temperature sensitive device 232a coupled to a first temperature sensitive component mount 132a, and a second temperature sensitive device 232b coupled to a second temperature sensitive component mount 132b.

To minimize the amount of heat that is transferred to the first and second temperature sensitive component mounts 132a, 132b, a plurality of thermal conductor traces 142 are coupled to the insulator substrate 140. The plurality of thermal conductor traces 142 are arranged into first enhanced thermal conduction regions 150 between the heat generating component mount 130 and the first and second temperature sensitive component mount 132a, 132b, and between the first and second temperature sensitive component mounts 132a, 132b themselves. Similar to the embodiment depicted in FIG. 9, the embodiment of the heat transfer management apparatus 400 depicted in FIG. 10 includes a plurality of the thermal conductor traces 142 are positioned transverse to the shielding path projections 180 that extend between the heat generating component mount 130 and the first and second temperature sensitive component mounts 132a, 132b. Additionally, the composite lamina 420 includes a plurality of thermal conductor traces 142 that are positioned transverse to the intermediate shielding path projections 182 that extend between the first and second temperature sensitive component mount 132a, 132b. At positions spaced apart from the shielding path projections 180 and the intermediate shielding path projections 182, the thermal conductor traces 142 are arranged into enhanced thermal conduction regions 152. The thermal conductor traces 142 may steer heat flux along the thermal conductor traces 142 and steer the heat flux in directions generally away from the temperature sensitive component mounts 132 and towards locations where the heat flux may be rejected into the surrounding environment, for example towards heat sinks (not shown).

Figure 11:
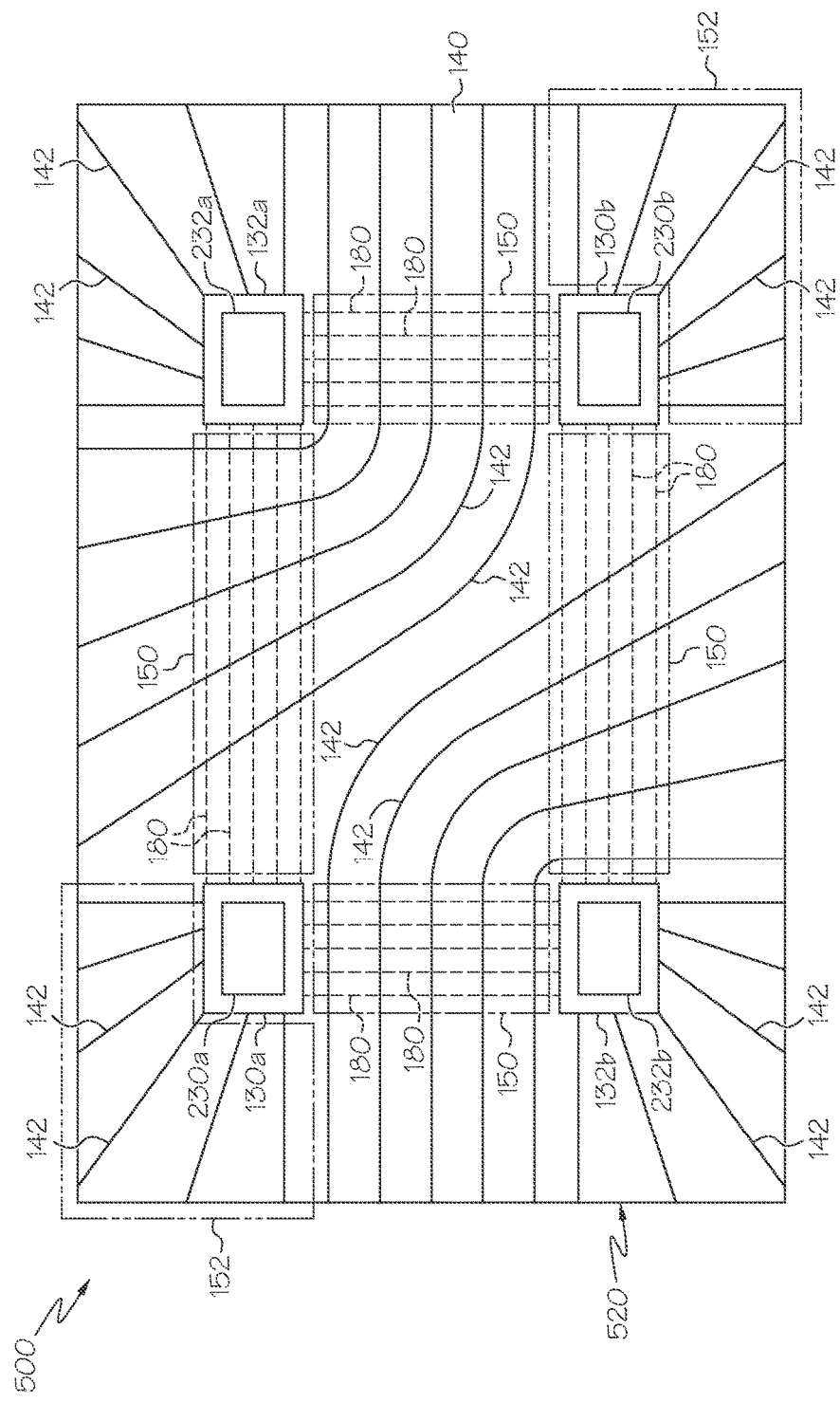
FIG. 11 schematically depicts a top view of a heat transfer management apparatus having a plurality of composite laminae according to one or more embodiments shown or described herein.

Referring now to FIG. 11, another embodiment of a heat transfer management apparatus 500 having a composite lamina 520 is depicted. In this embodiment, the heat transfer management apparatus 500 includes two heat generating components 230a, 230b that are coupled to the composite lamina 520 through respective heat generating component mounts 130a, 130b and two temperature sensitive components 232a, 232b that are coupled to the composite lamina 520 through respective temperature sensitive component mounts 132a, 132b.

Similar to the embodiments described hereinabove, to minimize the amount of heat that is transferred to the first and second temperature sensitive component mounts 132a, 132b, a plurality of thermal conductor traces 142 are coupled to the insulator substrate 140. The plurality of thermal conductor traces 142 are arranged into first enhanced thermal conduction regions 150 between the first and second heat generating component mounts 130a, 130b and the first and second temperature sensitive component mount 132a, 132b. The embodiment of the heat transfer management apparatus 500 depicted in FIG. 12 includes a plurality of the thermal conductor traces 142 that are positioned transverse to the shielding path projections 180 that extend between the first and second heat generating component mounts 130a, 130b and the first and second temperature sensitive component mounts 132a, 132b. At positions spaced apart from the shielding path projections 180, the thermal conductor traces 142 are arranged into enhanced thermal conduction regions 152. The thermal conductor traces 142 may steer heat flux along the thermal conductor traces 142 and steer the heat flux in directions generally away from the temperature sensitive component mounts 132 and towards locations where the heat flux may be rejected into the surrounding environment, for example towards the periphery of the composite lamina 520.

In the embodiment depicted in FIG. 11, the portions of the thermal conductor traces 142 that are positioned between the heat generating component mounts 130a, 130b and the periphery (which may include the perimeter) of the composite lamina 520 may be positioned into enhanced heat transfer regions. In these locations, the thermal conductor traces 142 are positioned such that adjacent thermal conductor traces 142 diverge from one another evaluated at positions proximate to the periphery of the composite lamina 520. By positioning the thermal conductor traces 142 along the insulator substrate 140 at configurations that diverge with increasing distance from the first and second heat generating component mounts 130a, 130b, a substantial portion of the heat flux generated by the first and second heat generating components 230a, 230b (which are coupled to the first and second heat generating component mounts 130a, 130b) may be directed towards the periphery of the composite lamina 520 and away from the first and second temperature sensitive component mounts 132a, 132b. Additionally, the thermal conductivity evaluated from the first and second heat generating component mounts 130a, 130b may be greater in directions corresponding to the enhanced heat transfer region as compared to the reduced heat transfer regions between the first and second heat generating component mounts 130a, 130b and the first and second temperature sensitive component mounts 132a, 132b. Accordingly, by enhancing the flow of heat flux in the desired direction and away from the temperature sensitive component mounts 132a, 132b, temperature increase in the temperature sensitive component mounts 132a, 132b may be minimized.

It should be understood that certain elements of the various embodiments described hereinabove may be combined to provide a heat transfer management apparatus that satisfies the requirements of a particular end-user application. In particular embodiments, the heat transfer management apparatus may include one or more composite lamina having a variety of configurations of thermal conductor traces that are coupled to insulator substrates to provide a desired heat transfer profile along the heat transfer management apparatus. Heat transfer management apparatuses having a plurality of composite laminae may include vias that pass through the thickness of the composite lamina and place thermal conductor traces of different composite lamina into thermal conduction with one another.

It should now be understood that heat transfer management apparatuses according to the present disclosure include a composite laminae that includes an insulator substrate and a plurality of thermal conductor traces. The thermal conductor traces are arranged into a first enhanced thermal conduction region that reduces the heat flux in a direction from a heat generating component towards a temperature sensitive component while increasing the heat flux in a direction transverse to the direction from the heat generating component towards the temperature sensitive component. The thermal conductor traces are also arranged into a second enhanced thermal conduction region that increases the heat flux in a direction from the heat generating component towards the temperature sensitive component as compared to the transverse direction. Through selective positioning of the thermal conductor in the insulator substrate, the heat flux can be effectively steered along the thermal conductor traces to minimize increased temperature surrounding the temperature sensitive component.

While specific mention has been made herein to conductive heat transfer properties offered by the heat transfer management apparatuses described herein, the discussion hereinabove has been directed to heat transfer at steady-state operation. It should be understood that the parameters of the heat transfer management apparatuses may be modified to suit particular end-user requirements, including management of transient heat transfer. Management of heat flux in a transient time frame may be accommodated by modifying the materials used in heat transfer management apparatus, for example, the thermal conductor traces, the insulator substrate, the vias, the heat generating component mount, the temperatures sensitive component mount, and the heat sink. Additionally, for management of heat flux in a transient time frame along any one composite lamina, the configuration of the thermal conductor traces relative to the insulator substrate may be modified, including modifying the cross-sectional area of the thermal conductor traces as well as the relative spacing between adjacent thermal conductor traces and the shape of the thermal conductor traces. The listing of elements that may be modified to accommodate certain transient heat transfer characteristics should be considered to be illustrative and non-limiting examples.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A heat transfer management apparatus comprising:
a composite lamina comprising an insulator substrate and a plurality of thermal conductor traces coupled to the insulator substrate, where the plurality of thermal conductor traces are arranged into a first enhanced thermal conduction region and a second enhanced thermal conduction region, wherein at least one of the plurality of thermal conductor traces in the first enhanced thermal conduction region extends in a direction that is transverse to at least one of the thermal conductor traces in the second enhanced thermal conduction region;
a heat generating component mount;
a temperature sensitive component mount in electrical continuity with the heat generating component mount and positioned distally from the heat generating component mount; and
a shielding path projection that extends from the heat generating component mount to the temperature sensitive component mount,
wherein the shielding path projection is aligned with the plurality of thermal conductor traces such that at least a portion of the shielding path projection is perpendicular to at least a portion of one or more of the plurality of thermal conductor traces at an intersection of the shielding path projection with the one or more of the plurality of thermal conductor traces to cause heat flux to be steered away from the temperature sensitive component mount.

2. The heat transfer management apparatus of claim 1, wherein at least one of the one or more thermal conductor traces that is perpendicular to the shielding path projection is electrically isolated from the heat generating component mount and the temperature sensitive component mount.

3. The heat transfer management apparatus of claim 1, wherein:
the composite lamina comprises a plurality of shielding path projections that extend from a portion of a perimeter of the heat generating component mount to a portion of a perimeter of the temperature sensitive component mount; and at least one of the thermal conductor traces is transverse to the plurality of shielding path projections between the portion of the perimeter of the heat generating component mount and the portion of the perimeter of the temperature sensitive component mount.

4. The heat transfer management apparatus of claim 3, wherein at least one of the thermal conductor traces is perpendicular to the plurality of shielding path projections between the portion of the perimeter of the heat generating component mount and the portion of the perimeter of the temperature sensitive component mount.

5. The heat transfer management apparatus of claim 1, further comprising:

a second temperature sensitive component mount coupled to the composite lamina; and a second shielding path projection extending from the heat generating component mount to the second temperature sensitive component mount, wherein at least one of the plurality of thermal conductor traces is transverse to the second shielding path projection.

6. The heat transfer management apparatus of claim 5, wherein an intermediate shielding path projection extends from the temperature sensitive component mount towards the second temperature sensitive component mount, and one of the plurality of thermal conductor traces is transverse to the intermediate shielding path projection.

7. The heat transfer management apparatus of claim 6, wherein at least one of the plurality of thermal conductor traces is transverse to the intermediate shielding path projection and at least one of the shielding path projection or the second shielding path projection.

8. The heat transfer management apparatus of claim 1, further comprising a targeted heat rejection region, wherein at least one of the plurality of thermal conductor traces is in thermal continuity with the targeted heat rejection region.

9. The heat transfer management apparatus of claim 8, wherein at least one of the plurality of thermal conductor traces is generally parallel to a focusing path projection that extends from the heat generating component towards the targeted heat rejection region at positions spaced apart from the shielding projection.

10. The heat transfer management apparatus of claim 8; wherein the targeted heat rejection region comprises a heat sink.

11. The heat transfer management apparatus of claim 1, wherein at least one of the plurality of thermal conductor traces is in electrical continuity with the heat generating component mount and the temperature sensitive component mount.

12. The heat transfer management apparatus of claim 1, wherein at least two of the plurality of thermal conductor traces diverge from one another with increasing distance from the heat generating component mount.

13. The heat transfer management apparatus of claim 1, wherein the heat generating component mount and the temperature sensitive component mount are both coupled to the composite lamina.

14. The heat transfer management apparatus of claim 1, further comprising:

a plurality of composite laminae, each of the composite laminae comprising an insulator substrate and a plurality of thermal conductor traces coupled to the insulator substrate; and a via extending through a plurality of the composite laminae, the vias places the thermal conductor traces of different composite lamina into thermal continuity with one another.

15. The heat transfer management apparatus of claim 14, further comprising:

a heat generating component coupled to the heat generating component mount of one of the composite lamina; and a temperature sensitive component coupled to the temperature sensitive component mount of one of the composite lamina.

16. The heat transfer management apparatus of claim 15, wherein the heat generating component mount and the temperature sensitive component mount are coupled to different composite laminae.

17. A heat transfer management apparatus comprising:

a composite lamina comprising an insulator substrate and a plurality of thermal conductor traces coupled to the insulator substrate, where the plurality of thermal conductor traces are arranged into a first enhanced thermal conduction region and a second enhanced thermal conduction region;

a heat generating component mount coupled to the composite lamina;

a temperature sensitive component mount coupled to the composite lamina and positioned distally from the heat generating component mount; and a targeted heat rejection region positioned distally from the heat generating component mount; and a shielding path projection positioned proximate to the first enhanced thermal conduction region, the shielding path projection extending from the heat generating component mount to the temperature sensitive component mount, wherein:

the shielding path projection is aligned with the plurality of thermal conductor traces such that at least a portion of the shielding path projection is perpendicular to at least a portion of the one or more of the plurality of thermal conductor traces at an intersection of the shielding path projection with the one or more of the plurality of thermal conductor traces to cause heat flux to be steered away from the temperature sensitive component mount;

a focusing path projection is positioned proximate to the second enhanced thermal conduction region and extends from the heat generating component towards the targeted heat rejection region at positions spaced apart from the shielding path projections; and the thermal conductor traces are arranged relative to the insulator substrate to increase thermal conduction in a direction generally parallel to the focusing path projections in the second enhanced thermal conduction region to increase thermal conduction in the direction of the focusing path projections.

18. The heat transfer management apparatus of claim 17, wherein the thermal conductor traces extend in a direction transverse to the shielding path projections in the first enhanced thermal conduction region.

19. The heat transfer management apparatus of claim 17, wherein the thermal conductor traces extend in a direction that is generally parallel to the focusing path projections.

20. A heat management apparatus comprising:

a composite lamina comprising an insulator substrate and a plurality of thermal conductor traces coupled to the insulator substrate, where the plurality of thermal conductor traces are arranged into a first enhanced thermal conduction region and a second enhanced thermal conduction region;

a heat generating component mount coupled to the composite lamina;

a temperature sensitive component mount coupled to the composite lamina and positioned distally from the heat generating component mount;

a shielding path projection that extends from the heat generating component mount to the temperature sensitive component mount; and a targeted heat rejection region positioned distally from the heat generating component mount, wherein:

the shielding path projection is aligned with the plurality of thermal conductor traces such that at least a portion of the shielding path projection is perpendicular to at least a portion of one or more of the plurality of thermal conductor traces at an intersection of the shielding path projection with one or more of the plurality of thermal conductor traces to cause heat flux to be steered away from the temperature sensitive component mount;

a focusing path projection is positioned proximate to the second enhanced thermal conduction region and extends from the heat generating component towards the targeted heat rejection region at positions spaced apart from the shielding path projections;

the thermal conductor traces are arranged relative to the insulator substrate to provide an anisotropic thermal conduction along the composite lamina, in which the thermal conduction is increased in a direction transverse to the shielding path projection and increased in a direction parallel to the focusing path projection.

* * * * *